United States Patent
Shibayama

(10) Patent No.: US 8,422,619 B2
(45) Date of Patent: *Apr. 16, 2013

(54) CLOCK FREQUENCY DIVIDER CIRCUIT, CLOCK DISTRIBUTION CIRCUIT, CLOCK FREQUENCY DIVISION METHOD, AND CLOCK DISTRIBUTION METHOD

(75) Inventor: Atsufumi Shibayama, Tokyo (JP)

(73) Assignee: NEC Corporation, Tokyo (JP)

( * ) Notice: Subject to any disclaimer, the term of this patent is extended or adjusted under 35 U.S.C. 154(b) by 24 days.

This patent is subject to a terminal disclaimer.

(21) Appl. No.: 13/058,463

(22) PCT Filed: Jul. 30, 2009

(86) PCT No.: PCT/JP2009/003631
§ 371 (c)(1),
(2), (4) Date: Feb. 10, 2011

(87) PCT Pub. No.: WO2010/050097
PCT Pub. Date: May 6, 2010

(65) Prior Publication Data
US 2011/0200162 A1    Aug. 18, 2011

(30) Foreign Application Priority Data
Oct. 29, 2008    (JP) ................. 2008-278497

(51) Int. Cl.
*H03K 21/00*    (2006.01)
(52) U.S. Cl.
USPC ............... 377/48; 327/115; 327/117; 377/47
(58) Field of Classification Search ......... 327/113–115, 327/117, 118; 377/47, 48
See application file for complete search history.

(56) References Cited

U.S. PATENT DOCUMENTS

| | | | | |
|---|---|---|---|---|
| 5,040,197 A * | 8/1991 | Theobald | ............. | 377/48 |
| 5,088,057 A * | 2/1992 | Amrany et al. | ............. | 708/103 |
| 7,205,800 B2 * | 4/2007 | Hasegawa | ............. | 327/115 |
| 7,893,742 B2 * | 2/2011 | Shibayama et al. | ............. | 327/161 |
| 8,081,017 B2 * | 12/2011 | Shibayama et al. | ............. | 327/115 |
| 8,253,450 B2 * | 8/2012 | Shibayama | ............. | 327/115 |
| 2011/0193596 A1 * | 8/2011 | Shibayama | ............. | 327/115 |

FOREIGN PATENT DOCUMENTS

| | | |
|---|---|---|
| JP | 2000036832 A | 2/2000 |
| JP | 2001127618 A | 5/2001 |
| JP | 2001320022 A | 11/2001 |
| JP | 2005045507 A | 2/2005 |
| JP | 2006148807 A | 6/2006 |
| JP | 2006245631 A | 9/2006 |

OTHER PUBLICATIONS

International Search Report for PCT/JP2009/003631 mailed Aug. 25, 2009.

* cited by examiner

*Primary Examiner* — Patrick O'Neill

(57) ABSTRACT

To provide a clock frequency divider circuit that generates a clock signal enabling an expected proper communication in communication with a circuit operating by a clock having a different frequency. A clock frequency division circuit according to the present invention generates an output clock signal obtained by dividing a frequency of an input clock signal into N/S by subtracting (S−N) clock pulses from S clock pulses of the input clock signal based on a frequency division ratio defined as N/S. The clock frequency division circuit generates a control signal used to preferentially subtract a clock pulse at a timing other than a communication timing of data communication performed by a target circuit using the output clock signal among S clock pulses of the input clock signal. Further, it generates the output clock signal by subtracting a clock pulse of the input clock signal according to the generated control signal.

11 Claims, 9 Drawing Sheets

CLOCK FREQUENCY DIVIDER CIRCUIT, CLOCK DISTRIBUTION CIRCUIT, CLOCK FREQUENCY DIVISION METHOD, AND CLOCK DISTRIBUTION METHOD

This application is the National Phase of PCT/JP2009/003631, filed Jul. 30, 2009, which is based upon and claims the benefit of priority from Japanese patent application No. 2008-278497, filed on Oct. 29, 2008, the disclosure of which is incorporated herein in its entirety by reference.

TECHNICAL FIELD

The present invention relates to a clock frequency divider circuit, a clock distribution circuit, a clock frequency division method, and a clock distribution method. In particular, the present invention relates to a clock frequency divider circuit, a clock distribution circuit, a clock frequency division method, and a clock distribution method to generate clock signals having different frequencies and distribute generated clock signals having different frequencies to respective functional blocks.

BACKGROUND ART

As a method for distributing a clock signal having a different frequency to each of a plurality of circuits (functional blocks) integrated in one semiconductor device, a method in which the frequency of a clock signal having a certain frequency is divided to generate clock signals having lower frequencies for respective functional blocks and the generated clock signals are distributed to the respective functional blocks has been proposed.

In a clock frequency divider circuit that divides the frequency of a clock signal to generate a clock signal having a lower frequency, it is easy to realize a divider circuit whose frequency division ratio, i.e., the ratio of the frequency of the generated clock signal to the frequency of the original clock signal is expressed as "1/M" (M is integer) (integer frequency divider circuit) by using a counter circuit.

Further, divider circuits capable of performing a frequency division even when the frequency division ratio is expressed as "N/M" (N and M are integers) (rational-number frequency divider circuit) have been also proposed (for example, Patent literatures 1 and 2). According to these related-art techniques, firstly, the value of the numerator of the frequency division ratio (the value of N in the frequency division ratio N/M) is cumulatively added at each cycle of the input clock signal. Next, if the addition result becomes larger than the value of the denominator of the frequency division ratio (the value of M in the frequency division ratio N/M), M is subtracted from the cumulative addition result. By performing these operations, and then appropriately masking (thinning out) clock pulses of the input clock signal by referring to the cumulative addition result, the related-art technique realizes a rational-number frequency division.

Further, as semiconductor devices become increasingly larger in scale and their operating frequencies become increasingly faster, the relative phase deviation between clock signals distributed in the semiconductor device, i.e., the so-called "clock skew" has been becoming a serious problem. If the clock skew becomes larger, the upper limit of the operating frequency of synchronous circuits is restricted, thus causing deterioration in performance.

As a technique to reduce the clock skew, clock tree circuits have been known in which clock buffers and clock wiring lines are arranged in a tree-like configuration. In this clock tree circuit, a clock buffer(s) are used at each level of the clock tree. Further, by designing the layout so that load capacities and wiring resistances become equal to each other, the delays that are caused in clock propagation paths extending from the input end of the clock tree to the respective output ends can be made equal to each other. As a result, it is expected that the phase differences between the clock signals occurring at the respective output ends become relatively smaller, and the clock skew is thereby reduced.

Specific examples of problems that occur in the above-described clock frequency divider circuit and the clock distribution circuit in the related art are explained with reference to FIGS. 8 and 9.

FIG. 8 shows an example of a semiconductor integrated circuit including circuits Ai (i is integer and $1 \leq i \leq 64$) operating by clocks Ai (i is integer and $1 \leq i \leq 64$), a communication circuit N operating by a clock N, a clock tree circuit 20, and a plurality of clock frequency divider circuits 100. The circuits Ai are connected to the communication circuit N, and communicate with each other through the communication circuit N. Each of the clock frequency divider circuits 100 is connected to one of the output ends of the clock tree circuit 20, thus forming a clock distribution circuit composed of the clock tree circuit 20 and the plurality of clock frequency divider circuits 100.

The clock tree circuit 20 uses a clock buffer(s) 22 at each level of the clock tree, and its layout is designed so that load capacities and wiring resistances become equal to each other. In this way, the clock skew of the clock S and the clocks Ai is reduced. Further, the clock N is also distributed by using a clock tree circuit (not shown) so that the distribution delays of the clock N and the clock S become equal to each other. In this way, the clock skew of the clock N, clock S, and clocks Ai is reduced, thus enabling the circuits Ai and the communication circuit N to communicate with each other in a synchronized manner.

The clock frequency divider circuits 100 in the related art generate the clocks Ai by performing a rational-number frequency division on the clock S, which is distributed by the clock tree circuit 20, based on input frequency division ratio setting.

The clock frequency divider circuits 100 in the related art realize a frequency division by selectively masking clock pulses of the input clock signals. However, this related-art technique does not give any consideration to the communication with the communication circuit N operating by a clock having a different frequency. Therefore, there is a problem that the communication with the communication circuit N requires a special clock transfer circuit and/or special timing design. In addition, there is another problem that the communication performance deteriorates because of the above-described problem. Further, there is another problem that when the frequency division ratio is changed, it is necessary to change the communication timing with the communication circuit N according to that change.

FIG. 9 is a timing diagram showing an example of a clock frequency division performed by a clock frequency divider circuit 100 in the related art. The figure shows clocks Ai generated by dividing the frequency of the clock S at frequency division ratios 11/12 to 4/12. The clocks Ai can be generated by appropriately masking clock pulses of the input clock S. For example, a clock Ai corresponding to the frequency division ratio 9/12 is generated by masking three clock pulses at timings T3, T8 and T11 among the twelve clock pulses at the timings T0 to T11 of the clock S.

In this example, assume that the frequency of the clock N is one third of that of the clock S. That is, the frequency division ratio of the clock N to the clock S is 1/3 (=4/12). Note that the phase relation between the clock N and the clocks Ai makes a full circle in twelve cycles of the clock S. The timings of the twelve cycles, in which the phase relation makes a full circle, are represented by "T0" to "T11".

Assume also that the circuits Ai and the communication circuit N communicate with each other at the timings T0, T3, T6 and T9, which correspond to all the rising edge timings of the clock N. In particular, at the timings T0, T3, T6 and T9, the circuits Ai output a signal to the communication circuit N and/or receive a signal sent from the communication circuit N. Similarly, at the timings T0, T3, T6 and T9, the communication circuit N outputs a signal to the circuits Ai and/or receives a signal sent from the circuits Ai.

However, the clock frequency divider circuit 100 in the related art does not give any consideration to the communication with a circuit operating by a clock having a different frequency. Therefore, there are cases where a clock pulse of the clock S is masked even at this communication timing to generate a certain clock Ai.

In the example shown in FIG. 9, some of the clock pulses are masked at the timings T3, T6 and T9 among the communication timings to generate the clocks Ai. Specifically, at the timing T3, the clock pulse is masked for the frequency division ratios 9/12 (110a), 6/12 (110b), and 5/12 (110c). Similarly, at the timing T6, the clock pulse is masked for the frequency division ratio 5/12 (110d). Similarly, at the timing T9, the clock pulse is masked for the frequency division ratios 7/12 (110e), 6/12 (110f), and 5/12 (110g).

If the clock pulse of the clock S is masked at the communication timing to generate a clock Ai as in the case of the above-described example, a circuit Ai operating by the generated clock Ai cannot receive a signal output from the communication circuit N operating by the clock N at an expected timing. Similarly, the circuit Ai operating by the clock Ai cannot output a signal at the timing that is expected by the communication circuit N operating by the clock N.

Therefore, in the clock frequency divider circuit in the related art, there is a problem that the communication with a circuit operating by a clock having a different frequency requires a special clock transfer circuit and/or special timing design to realize an expected proper communication operation. As a result, there is another problem that the communication performance deteriorates. Further, there is another problem that when the frequency division ratio is changed, it is necessary to change the timing of communication with the circuit operating by a clock having a different frequency according to that change.

Furthermore, in the clock distribution circuit shown in FIG. 8 in which each of the clock frequency divider circuits 100 is connected to one of the output ends of the clock tree circuit 20, the clock S, which is distributed by the clock tree circuit 20, always has a high frequency because its frequency is not divided. Therefore, there is another problem that the power consumption of the clock tree circuit 20 is large.

CITATION LIST

Patent Literature

Japanese Unexamined Patent Application Publication No. 2005-45507
Japanese Unexamined Patent Application Publication No. 2006-148807

SUMMARY OF INVENTION

Technical Problem

As has been explained above, there is a first problem in the clock frequency divider circuit and the clock distribution circuit in the related art that it is very difficult to perform an expected proper operation in communication with a circuit operating by a clock having a different frequency.

Further, there is a second problem that the power consumption of the clock tree circuit is large.

The present invention has been made in view of the first problem, and an object of the present invention is to provide a clock frequency divider circuit that generates a clock signal that makes it possible to perform an expected proper communication operation in communication with a circuit operating by a clock having a different frequency, a clock distribution circuit, a clock frequency division method, and a clock distribution method.

In another aspect, an object of the present invention is provide a clock frequency divider circuit capable of reducing the power consumption of a clock tree circuit, a clock distribution circuit, a clock frequency division method, and a clock distribution method in order to solve the second problem.

Solution to Problem

A clock frequency divider circuit in accordance with the present invention is a clock frequency divider circuit that generates an output clock signal obtained by dividing a frequency of an input clock signal into N/S (N is positive integer and S is positive integer greater than N) by subtracting (S−N) clock pulses from S clock pulses of the input clock signal based on a frequency division ratio defined as N/S, the clock frequency divider circuit including: a control circuit that generates a control signal used to preferentially subtract a clock pulse at a timing other than a communication timing of data communication performed by a target circuit using the output clock signal among S clock pulses of the input clock signal; and a processing circuit that generates the output clock signal by subtracting a clock pulse of the input clock signal according to the control signal generated by the control circuit.

Further, a clock distribution circuit in accordance with the present invention includes: a clock tree circuit; a first clock frequency divider circuit that performs a first frequency division on an input clock signal and outputs the obtained signal to the clock tree circuit; and second clock frequency divider circuits each of which receives one of a plurality of clock signals output from the clock tree circuit, performs a second frequency division on each of the clock signals, and outputs each of the obtained signals to a plurality of target circuits.

A clock frequency division method in accordance with the present invention is a clock frequency division method to generate an output clock signal obtained by dividing a frequency of an input clock signal into N/S (N is positive integer and S is positive integer greater than N) by subtracting (S−N) clock pulses from S clock pulses of the input clock signal based on a frequency division ratio defined as N/S, the clock frequency division method including: determining a clock pulse at a timing other than a communication timing of data communication performed by a target circuit using the output clock signal among S clock pulses of the input clock signal; and generating the output clock signal by subtracting the determined clock pulse.

A clock distribution method in accordance with the present invention includes: performing a first frequency division on an input clock signal; distributing a plurality of clock signals on which the first frequency division was performed; and performing a second frequency division on the distributed input clock signals and outputting the obtained signals to a plurality of circuits.

Advantageous Effects of Invention

In accordance with the present invention, it is possible to provide a clock frequency divider circuit that generates a clock signal that makes it possible to perform an expected proper communication operation in communication with a circuit operating by a clock having a different frequency, a clock distribution circuit, a clock frequency division method, and a clock distribution method.

Further, in accordance with another aspect of the present invention, it is possible to provide a clock frequency divider circuit capable of reducing the power consumption of a clock tree circuit, a clock distribution circuit, a clock frequency division method, and a clock distribution method.

DESCRIPTION OF EMBODIMENTS

First Exemplary Embodiment

Figure 1:
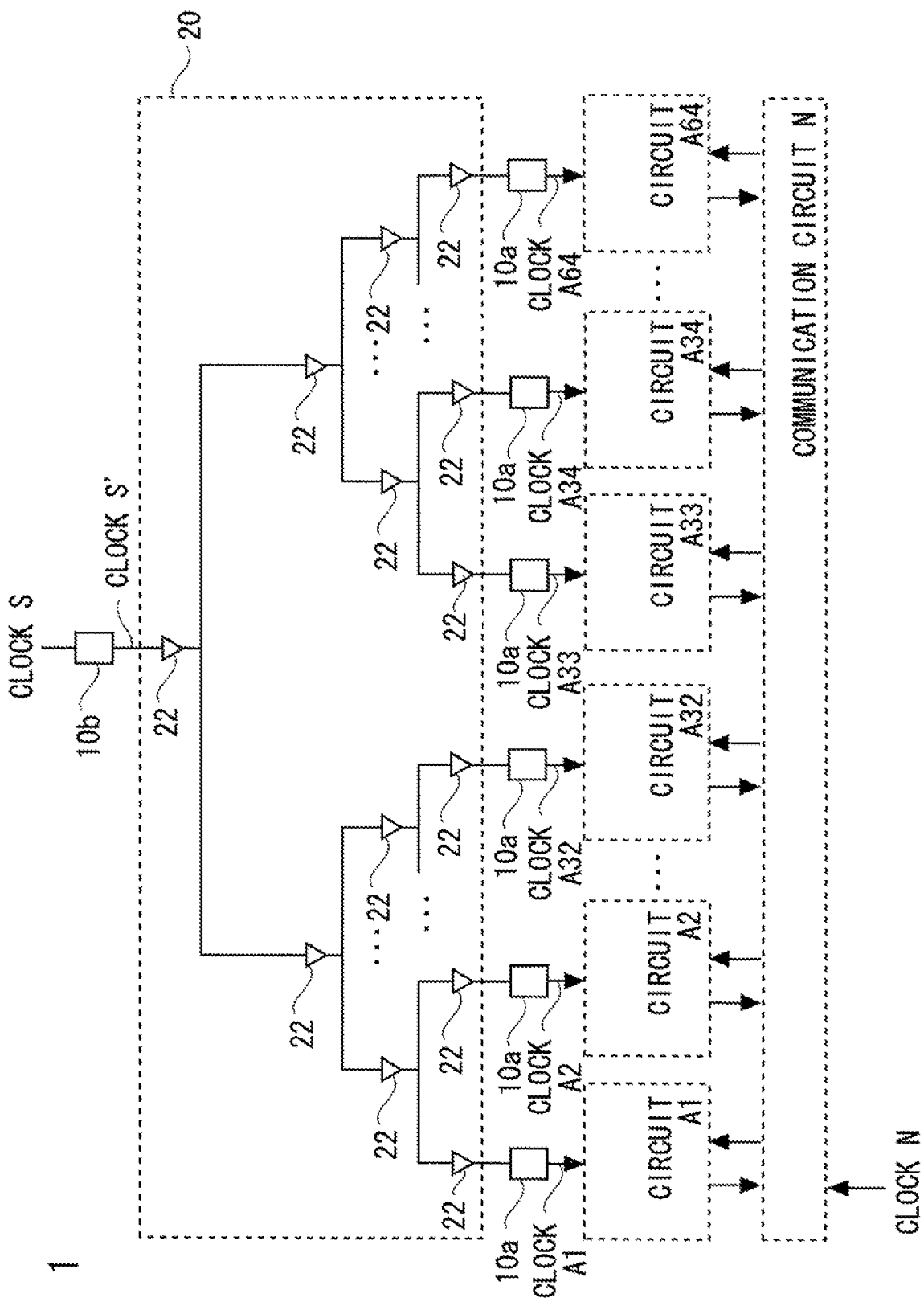
FIG. 1 is a configuration diagram of a semiconductor integrated circuit in the present invention.
Figure 8:
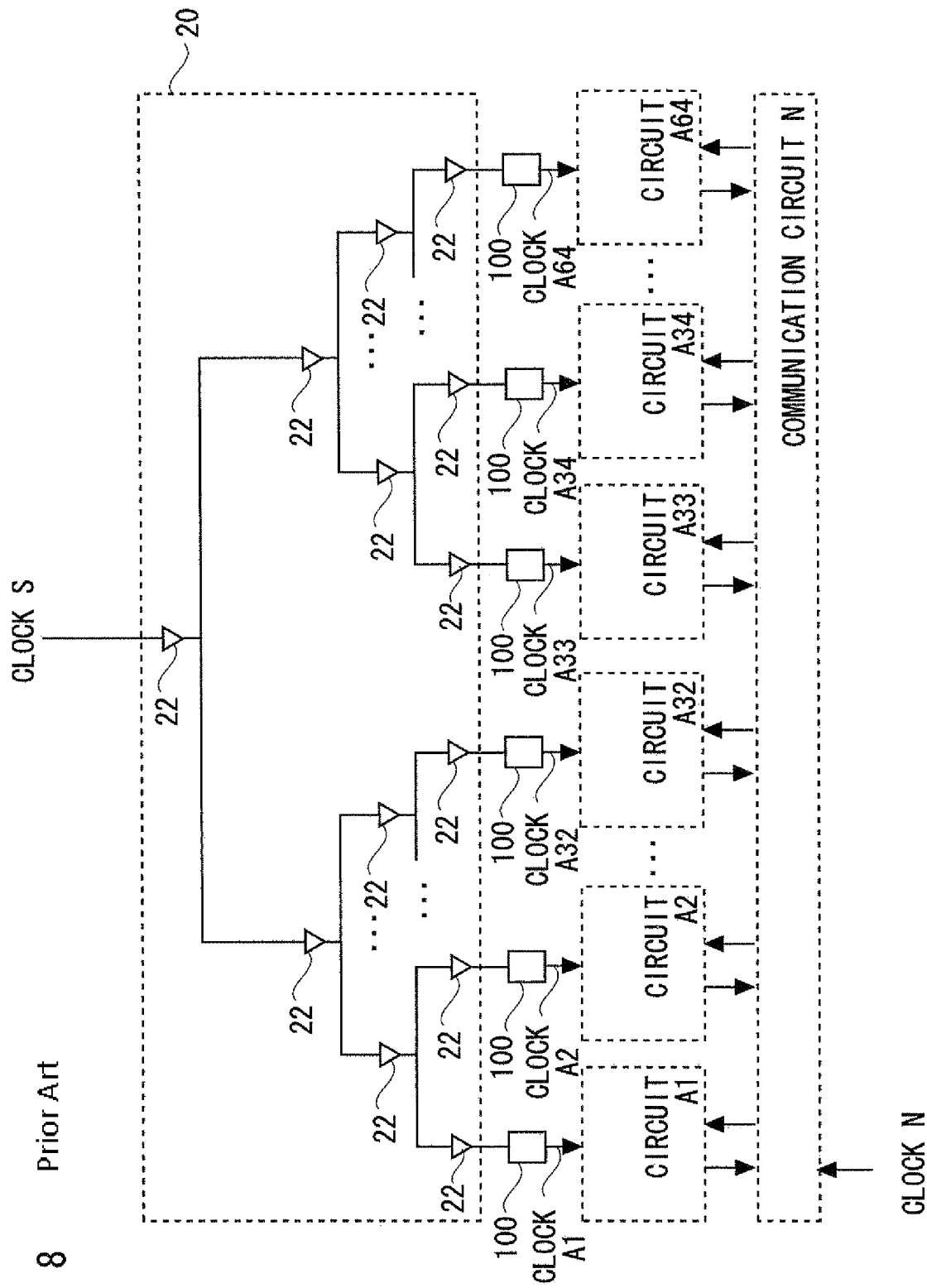
FIG. 8 is a configuration diagram of a semiconductor integrated circuit in related art.

Firstly, a clock distribution circuit in accordance with a first exemplary embodiment of the present invention is explained with reference to FIG. 1. FIG. 1 shows an example of a semiconductor integrated circuit including circuits Ai (i is integer and $1 \leq i \leq 64$) operating by clocks Ai (i is integer and $1 \leq i \leq 64$), a communication circuit N operating by a clock N, a clock tree circuit 20, and clock frequency divider circuits 10a and 10b. The same components as those of the semiconductor integrated circuit in the related art shown in FIG. 8 are denoted by the same signs.

The circuits Ai are connected to the communication circuit N, and communicate with each other through the communication circuit N. Each of the clock frequency divider circuits 10a is connected to one of the output ends of the clock tree circuit 20 and the clock frequency divider circuit 10b is connected to the input end of the clock tree circuit 20, thus forming a clock distribution circuit.

The clock tree circuit 20 uses a clock buffer(s) 22 at each level of the clock tree, and its layout is designed so that load capacities and wiring resistances become equal to each other. By doing so, the clock skew of the clock S is reduced. Further, the clock N is also distributed by using a clock tree circuit (not shown) so that the distribution delays of the clock N and the clock S become equal to each other. In this way, the clock skew of the clock N, clock S, and clocks Ai is reduced, thus enabling the circuits Ai and the communication circuit N to communicate with each other in a synchronized manner.

Figure 2:
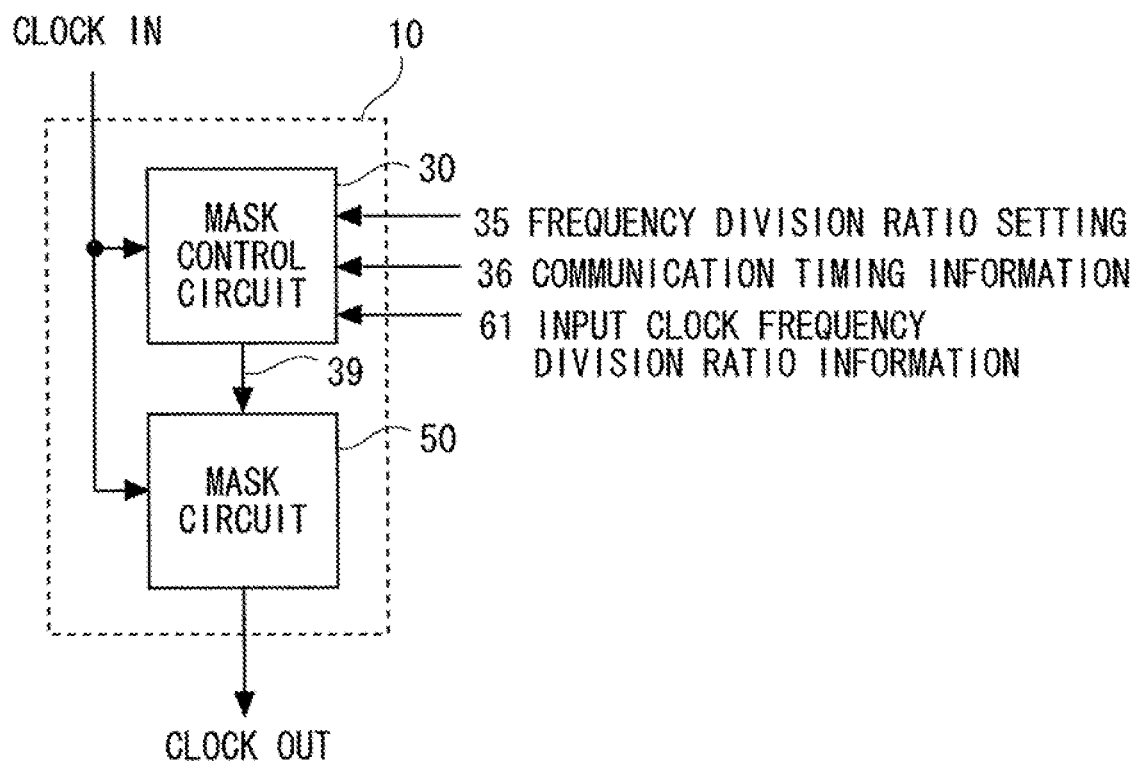
FIG. 2 is a configuration diagram of a clock frequency divider circuit in accordance with a first exemplary embodiment of the present invention.

FIG. 2 is a configuration diagram showing a configuration of a clock frequency divider circuit 10 in accordance with this exemplary embodiment. The clock frequency divider circuit 10 masks (S−N) clock pulses among consecutive S clock pulses of a clock IN (input clock signal) based on frequency division ratio defined as N/M (N is positive integer and M is positive integer greater than N) given by frequency division ratio setting 35 and frequency division ratio information of the clock IN defined as S/M (S is positive integer and M is positive integer greater than S) given by input clock frequency division ratio information 61. In this way, the clock frequency divider circuit 10 generates a clock OUT (output clock signal) by performing a rational-number frequency division on the clock IN at a frequency division ratio N/S.

Note that the clock IN is a clock obtained by dividing the frequency of the original clock signal into S/M. Therefore, the clock frequency divider circuit 10 generates a clock OUT that is equivalent to a clock obtained by dividing the frequency of the original clock signal, on which no frequency division was performed, at a frequency division ratio N/M. In other words, the clock frequency divider circuit 10 performs, based on a frequency division ratio N/M given by the frequency division ratio setting 35, a rational-number frequency division on an input clock signal, whose frequency was divided at a frequency division ratio S/M given by the input clock frequency division ratio information 61, at a frequency division ratio N/S. In this way, the clock frequency divider circuit 10 generates an output clock signal that is equivalent to a clock signal obtained by dividing the frequency of the original clock signal, on which no frequency division was performed, at the frequency division ratio N/M (=(S/M)×(N/S)).

Further, in addition to the above-described frequency division ratio setting 35 and the input clock frequency division ratio information 61, the clock frequency divider circuit 10 also receives communication timing information 36 indicating timings at which a circuit operating by a clock OUT performs communication, and generates a clock OUT in which the communication timings is taken into account based on these information items.

This clock frequency divider circuit 10 includes, as principal circuits, a mask circuit 50 and a mask control circuit 30.

The mask circuit 50 is a processing circuit having a function of masking clock pulses of a clock IN according to an input mask signal 39 and thereby generating and outputting a clock OUT.

The mask control circuit 30 is a control circuit having a function of outputting a mask signal 39 to the mask circuit 50 based on the communication timing information 36 indicating timings at which a circuit operating by the clock. OUT performs communication. The mask signal 39 is a signal in which mask timings at which clock pulses are masked are assigned. The number of the clock pulses to be masked is (S−N), i.e., a difference between S and N. Further, the mask timings are selected from any timings except for the communication timing at which the communication is performed among the consecutive S clock pulse timings.

Further, the mask control circuit 30 has a function of generating such a mask signal 39 that, for any timings at which a mask timing is assigned in the mask signal 39 when the frequency division ratio is small (the value of N/M or N/S is large), a mask timing is always assigned at those timings in the mask signal 39 when the frequency division ratio is larger (the value of N/M or N/S is smaller). Then, the mask control circuit 30 outputs the mask signal 39 to the mask circuit 50.

In the exemplary embodiment shown in FIG. 1, each of the clock frequency divider circuits 10a and the clock frequency divider circuit 10b is a clock frequency divider circuit having the same configuration as that of the clock frequency divider circuit 10. The clock frequency divider circuits 10a generate clocks Ai by performing a rational-number frequency division on a clock S', which is distributed by the clock tree circuit 20, based on the input frequency division ratio setting 35, the communication timing information 36, and the input clock frequency division ratio information 61. The clock frequency divider circuit 10b generates the clock S', which is distributed by the clock tree circuit 20, by performing a rational-number frequency division on a clock S based on the input frequency division ratio setting 35, the communication timing information 36, and the input clock frequency division ratio information 61.

All the circuits Ai communicate with the communication circuit N at the same timing, e.g., at all the rising edge timings of the clock N. Therefore, the same communication timing information 36 indicating this timing is supplied to all the clock frequency divider circuits 10a and 10b.

In contrast to this, the operating frequencies of the circuits Ai may be different from one another. Therefore, frequency division ratio setting 35 having a different value may be supplied to each of the clock frequency divider circuits 10a. Further, as for the frequency division ratio setting 35 of the clock frequency divider circuit 10b, the same value as that of frequency division ratio setting 35 in which the smallest frequency division ratio (the value of N/M is large) among all the clock frequency divider circuits 10a is set is supplied.

Further, input clock frequency division ratio information 61 indicating the frequency of the clock S', which is the input clock to the clock frequency divider circuits 10a, is supplied to each of the clock frequency divider circuits 10a. Similarly, input clock frequency division ratio information 61 indicating the frequency of the clock S, which is the input clock to the clock frequency divider circuit 10b, is supplied to the clock frequency divider circuit 10b.

The above-described frequency division ratio setting 35, the communication timing information 36, and the input clock frequency division ratio information 61, which are supplied to the clock frequency divider circuits 10a and 10b, may be supplied by a circuit at a higher level (not shown) or may be supplied by one of the circuits Ai.

Next, an operation of a clock frequency divider circuit in accordance with the first exemplary embodiment of the present invention is explained with reference to FIGS. 3 and 4.

Figure 3:
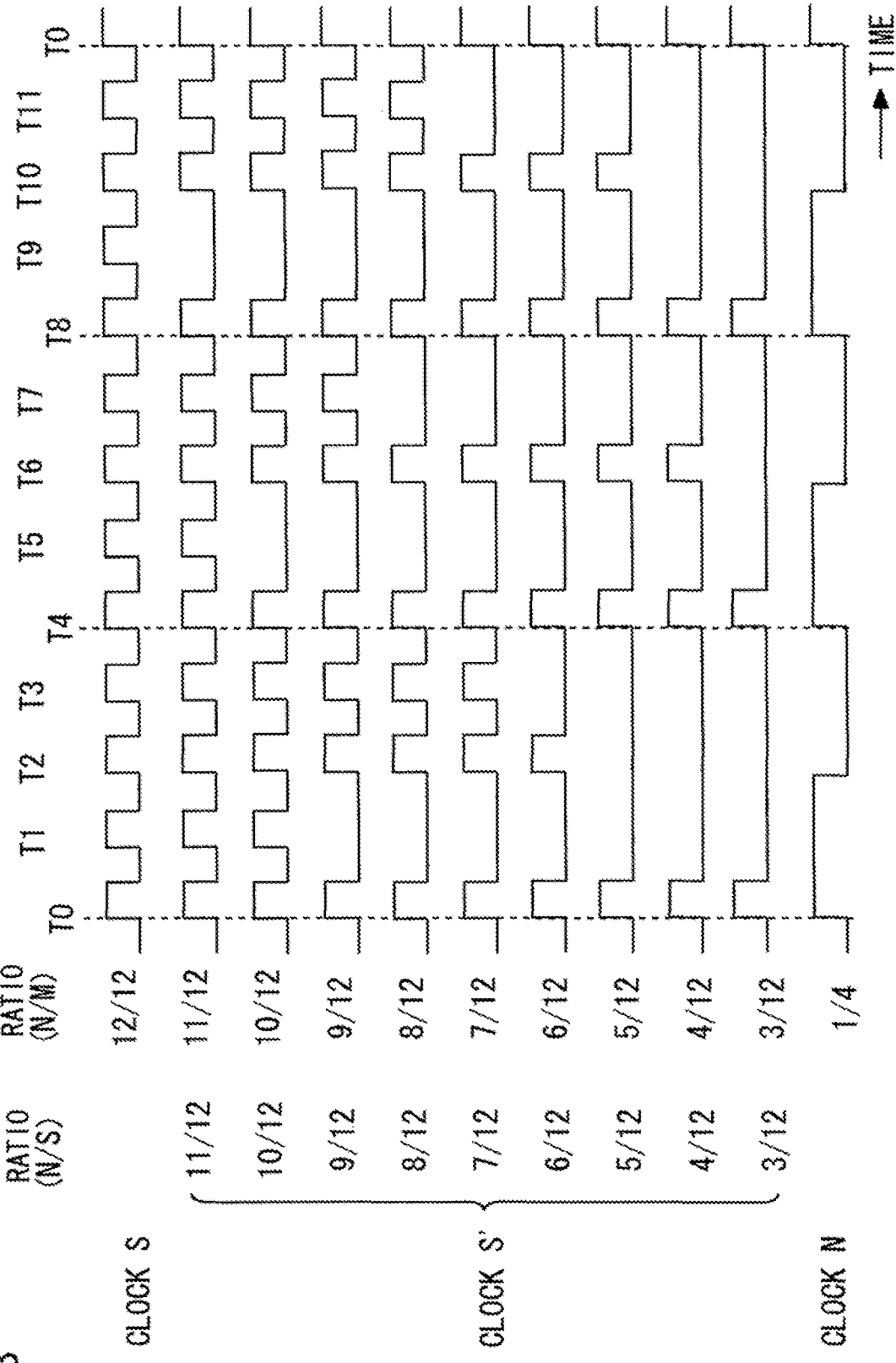
FIG. 3 is a timing chart of an example of a clock frequency division in accordance with a first exemplary embodiment of the present invention.

FIG. 3 is a timing chart showing an operation of a clock frequency division circuit 10b in accordance with a first exemplary embodiment of the present invention. In this example, assume that frequency division ratio denominator M=12 and frequency division ratio numerator N=11 to 3. An example in which the frequency of a clock S is divided at frequency division ratios 11/12 to 3/12 to generate clocks S' is explained.

Further, the clock S, which is an input clock signal, is a clock signal on which no frequency division was performed. Therefore, for the frequency division ratio S/M of the clock S given by the input clock frequency division ratio information 61, the input clock frequency division ratio numerator S=12 and the input clock frequency division ratio denominator M=12. Therefore, in this example, N/M=N/S.

In FIG. 3, the frequency of the clock N is one fourth of that of the clock S. That is, a case where the frequency division ratio of the clock N to the clock S is 1/4 (=3/12) and the clock N is in synchronization with the clock S is shown. In this case, the phase relation between the clock N and the clocks S' makes a full circle in twelve cycles of the clock S. In FIG. 3, the timings of the twelve cycles, in which the phase relation makes a full circle, are represented by "T0" to "T11". The circuits Ai perform data communication at the timings T0, T4 and T8 corresponding to the rising edge timings of the clock N.

The difference between the clock frequency divider circuit 10 in accordance with the first exemplary embodiment of the present invention and the clock frequency divider circuit 100 in the related art lies in that the clock frequency divider circuit 10 in accordance with the first exemplary embodiment of the present invention receives the above-described communication timing information indicating communication timings and thereby performs a rational-number frequency division in which the communication timings are taken into account based on the communication timing information. Specifically, clock pulses located at communication timings are never masked, and a rational-number frequency division is performed by masking clock pulses located at timings other than the communication timings. Further, for any timings at which a clock pulse is masked when the frequency division ratio is small (the value of N/M or N/S is large), the clock pulse is always masked at those timings when the frequency division ratio is larger (the value of N/M or N/S is smaller) to realize a rational-number frequency division.

In the example of the clock frequency division shown in FIG. 3, the clocks S' are generated by:
(1) masking no clock pulse at the timings T0, T4 and T8, which are the communication timings, and masking clock pulses at any of the timings T1, T2, T3, T5, T6, T7, T9, T10 and T11, which are not the communication timings; and
(2) for any timings at which a clock pulse is masked when a frequency division ratio is small, masking the clock pulse without fail at those timings when the frequency division ratio is larger.

Therefore, the mask control circuit 30 generates a mask signal 39 in which mask timings are assigned in such a manner that (S−N) clock pulses are masked at any of the timings T1, T2, T3, T5, T6, T7, T9, T10 and T11, which are not the above-described communication timings, and for any timings at which a clock pulse is masked when the frequency division ratio is small, the clock pulse is always masked at those timings when the frequency division ratio is larger.

The clocks S' like these can be generated by additionally assigning a timing at which a clock pulse is masked in a clock S' corresponding to a smaller frequency division ratio.

For example, a clock S' corresponding to a frequency division ratio 11/12 can be generated by assigning a mask timing at any timing other than the timings T0, T4 and T8 among the twelve clock pulses at timings T0 to T11 of the clock S, e.g., at a timing T9. Further, a clock S' corresponding to a frequency division ratio 10/12 can be generated by additionally assigning a mask timing at a timing T5. Further, a clock S' corresponding to a frequency division ratio 9/12 can be generated by additionally assigning a mask timing at a timing T1.

Further, a clock S' corresponding to a frequency division ratio 8/12 can be generated by additionally assigning a mask timing at a timing T7.

Further, a clock S' corresponding to a frequency division ratio 7/12 can be generated by additionally assigning a mask timing at a timing T11. Further, a clock S' corresponding to a frequency division ratio 6/12 can be generated by additionally assigning a mask timing at a timing T3. Further, a clock S' corresponding to a frequency division ratio 5/12 can be generated by additionally assigning a mask timing at a timing T2. Further, a clock S' corresponding to a frequency division ratio 4/12 can be generated by additionally assigning a mask timing at a timing T10. Furthermore, a clock S' corresponding to a frequency division ratio 3/12 can be generated by additionally assigning a mask timing at a timing T6.

Figure 4:
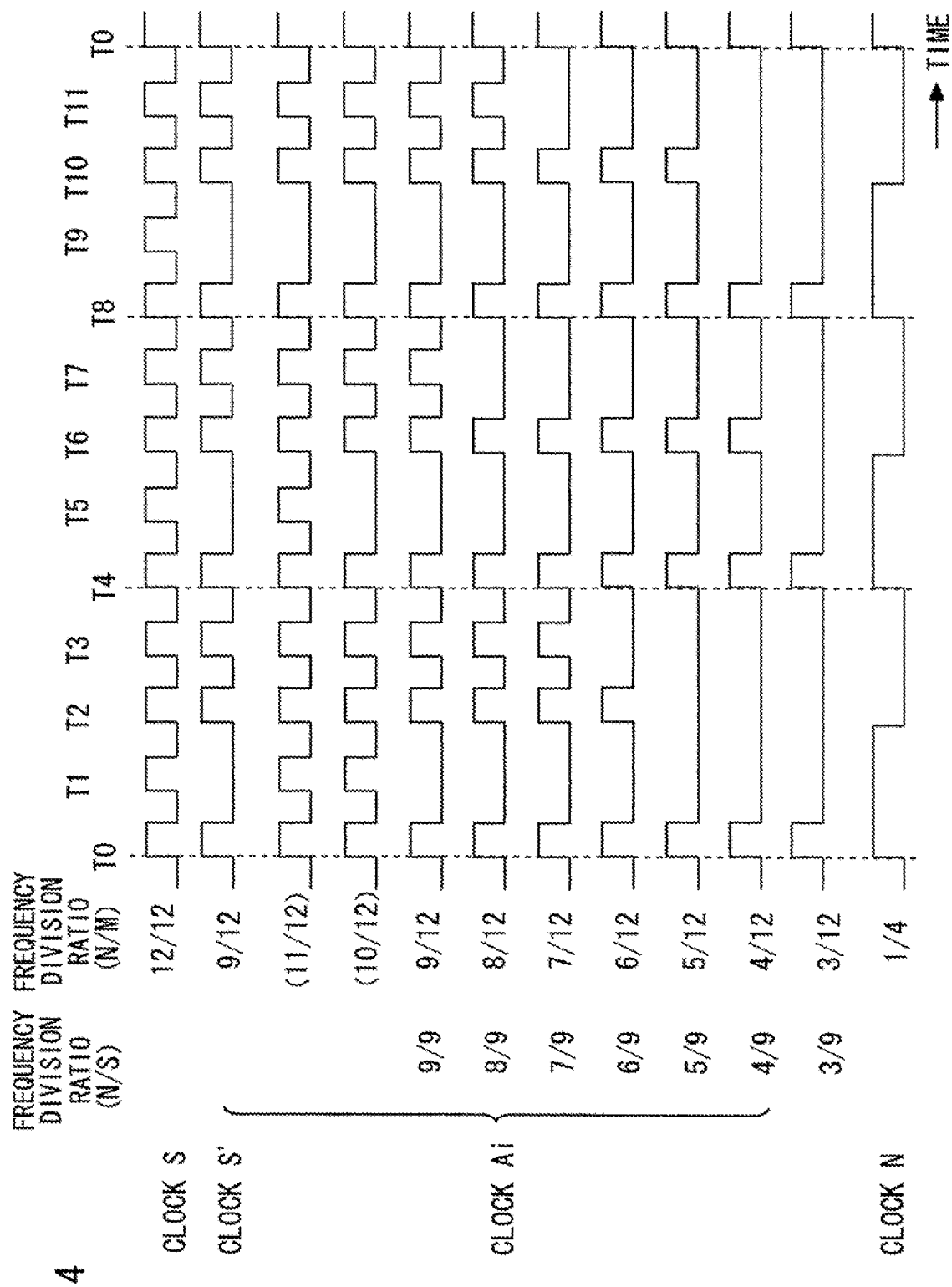
FIG. 4 is a timing chart of an example of a clock frequency division in accordance with a first exemplary embodiment of the present invention.

FIG. 4 is a timing chart showing an operation of a clock frequency divider circuit 10a in accordance with the first exemplary embodiment of the present invention. The operation of the clock frequency divider circuit 10a is the same as that of the clock frequency divider circuit 10b shown in FIG. 3 except that its input clock is a clock S' whose frequency is possibly divided by the clock frequency divider circuit 10b. The timing at which a clock pulse is masked for the clock S is also the same.

A case where the frequency division ratio denominator M=12 and the frequency division ratio numerator N=9 to 3 for a frequency division ratio N/M given by the frequency division ratio setting 35 is explained hereinafter as an example. In this example, assume that the clock S', which is the input clock signal, is a clock obtained by dividing the frequency of the clock S at a frequency division ratio 9/12. Therefore, for the frequency division ratio S/M defining the frequency division ratio of the clock S' that is given by the input clock frequency division ratio information 61, the input clock frequency division ratio numerator S=9 and the input clock frequency division ratio denominator M=12.

That is, it is an example case where the frequency of the clock S' corresponding to a frequency division ratio 9/12 is divided at frequency division ratios 9/9 to 3/9 to generate clocks Ai. Therefore, it is an example case where clocks Ai equivalent to clock signals obtained by dividing the frequency of the clock S at frequency division ratios 9/12 to 3/12.

As described previously, for the frequency division ratio setting 35 of the clock frequency divider circuit 10b, the same value as that of frequency division ratio setting 35 in which the smallest frequency division ratio (the value of N/M is large) among all the clock frequency divider circuits 10a is set is supplied. Therefore, in this example, the clock frequency divider circuit 10a generates clocks Ai that are obtained by performing a frequency division at any of the frequency division ratios 9/12 to 3/12. FIG. 4 also shows the waveforms of clocks Ai corresponding to frequency division ratios 11/12 and 10/12 for the sake of comparison to those of FIG. 3. However, these frequency division ratios are never set in this example.

Similarly to FIG. 3, the frequency of the clock N is one fourth of the clock S in FIG. 4. That is, a case where the frequency division ratio of the clock N to the clock S is 1/4 (=3/12) and the clock N is in synchronization with the clock S is shown. Further, the clock S' is generated by dividing the frequency of the clock S at a frequency division ratio 9/12. In this case, the phase relation between the clock N and the clocks S', and between the clock N and the clocks Ai makes a full circle in twelve cycles of the clock S. In FIG. 4, the timings of the twelve cycles, in which the phase relation makes a full circle, are represented by "T0" to "T11". The circuits Ai and the communication circuit N perform data communication at the timings T0, T4 and T8 corresponding to the rising edge timings of the clock N.

In the example of the clock frequency division shown in FIG. 4, the clocks Ai are also generated by:
(1) masking no clock pulse at the timings T0, T4 and T8, which are the communication timings, and masking clock pulses at any of the timings T1, T2, T3, T5, T6, T7, T9, T10 and T11, which are not the communication timings; and
(2) for any timings at which a clock pulse is masked when a frequency division ratio is small, masking the clock pulse without fail at those timings when the frequency division ratio is larger.

Therefore, the mask control circuit 30 generates a mask signal 39 in which mask timings are assigned in such a manner that (S−N) clock pulses are masked at any of the timings T1, T2, T3, T5, T6, T7, T9, T10 and T11, which are not these communication timings, and for any timings at which a clock pulse is masked when the frequency division ratio is small, the clock pulse is always masked at those timings when the frequency division ratio is larger.

As has been explained above, the clock distribution circuit in accordance with the first exemplary embodiment performs, based on a frequency division ratio N/M given by the frequency division ratio setting 35, a rational-number frequency division on an input clock signal, whose frequency was divided at a frequency division ratio S/M given by the input clock frequency division ratio information 61, at a frequency division ratio N/S in order to generate an output clock signal that is equivalent to a clock signal obtained by dividing the frequency of the original clock signal, on which no frequency division was performed, at the frequency division ratio N/M. Therefore, it is possible to lower the frequency of the input clock signal in advance by dividing the frequency of the input clock signal.

Further, the clock distribution circuit in accordance with the first exemplary embodiment generates clocks in such a manner that, for any timings at which a clock pulse is masked when the frequency division ratio is small, the clock pulse is always masked at those timings when the frequency division ratio is larger. Further, for the frequency division ratio setting of the clock frequency divider circuit 10b, the same value as that of frequency division ratio setting in which the smallest frequency division ratio (the value of N/M or N/S is large) among all the clock frequency divider circuits 10a is set is supplied. Therefore, the clock frequency divider circuit 10a can generate, from a clock S' whose frequency is divided by the clock frequency divider circuit 10b, clocks Ai corresponding to frequency division ratios equal to and greater than frequency division ratio of the clock S'. This is because, for any timings at which a clock pulse is masked in the clock S', the clock pulse is always masked at those timings in the clocks Ai, and for any timings at which a clock pulse is not masked in the clocks Ai, the clock pulse is never masked at those timings in the clock S'.

In other words, the frequency of the clock S' can be divided at a frequency division ratio equal to the smallest frequency division ratio (the value of N/M is large) among all the clocks Ai. Therefore, it is possible to lower the frequency of the clock signal (clock S'), which is distributed by the clock tree circuit 20. As a result, there is an advantageous effect that the power consumption of the clock tree circuit 20 can be reduced.

Figure 9:
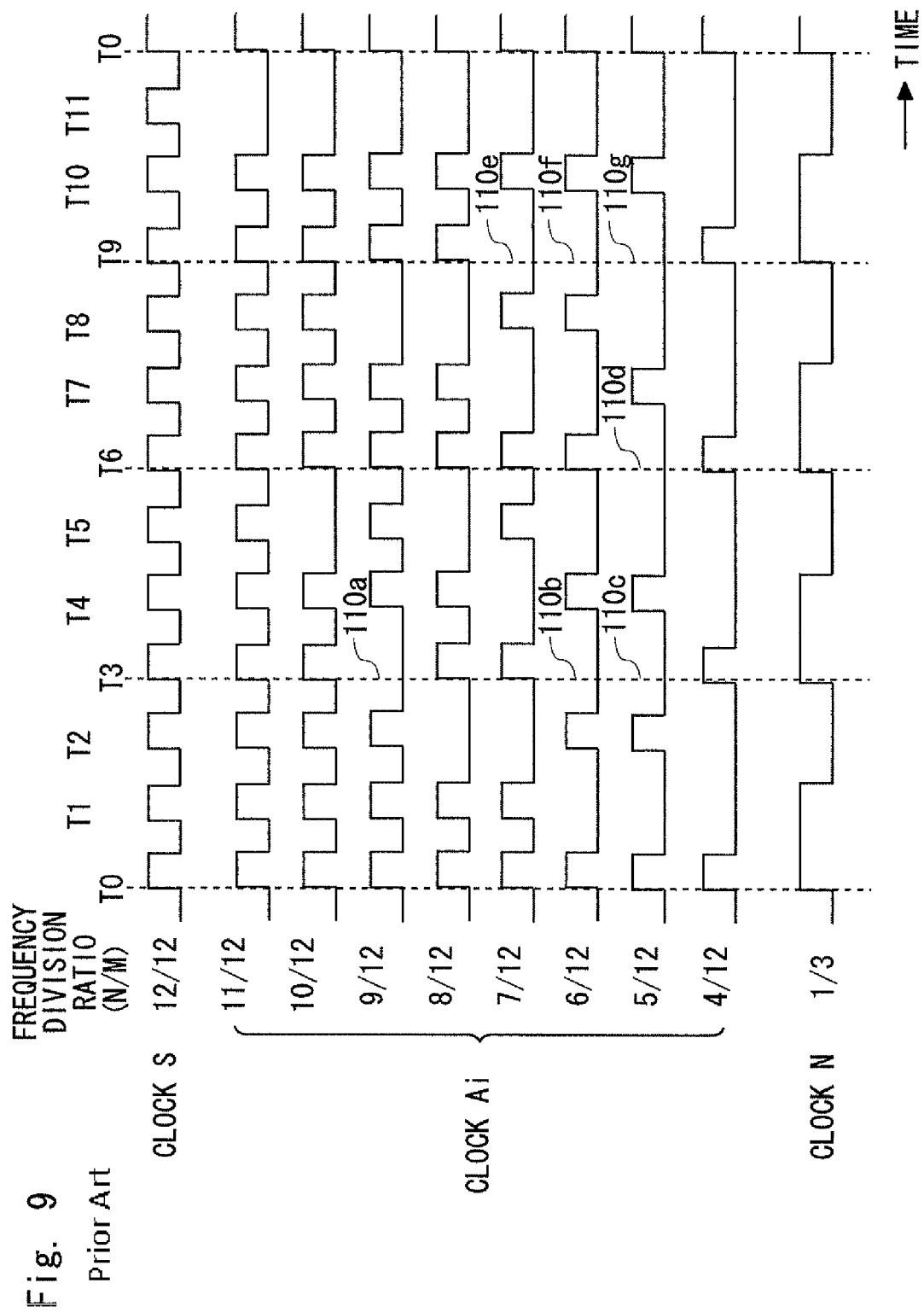
FIG. 9 is a timing chart of an example of a clock frequency division in related art.

In contrast to this, in a clock distribution method in which no consideration is given to the division of the frequency at the input end of the clock tree circuit as in the case of the related-art technique shown in FIG. 9, the frequency of the clock S' cannot always be divided at a frequency division ratio equal to the smallest frequency division ratio among all the clocks Ai.

In the example shown in FIG. 9, for example, there are no clock pulses at the timings T3 and T8 in the clock S' corresponding to a frequency division ratio 9/12. Therefore, it is impossible to generate, from the clock S' corresponding to the frequency division ratio 9/12, clocks Ai corresponding to frequency division rations 8/12, 7/12, 6/12 and 4/12 in which clock pulses are necessary at the timings T3 and T8. Therefore, even if the smallest frequency division ratio is 9/12 among all the clocks Ai, the clock S' cannot always be divided at the frequency division ratio 9/12. Therefore, even if a clock frequency divider circuit is connected at the input end of the clock tree, the power consumption of the clock tree circuit cannot be sufficiently reduced.

Further, the mask control circuit 30 generates a mask signal 39 and outputs the generated mask signal 39 to the mask circuit 50 in the first exemplary embodiment. The mask signal 39 is a signal in which mask timings at which clock pulses are masked are assigned. The mask timings are selected from any timings except for communication timings at which communication is performed between the circuits Ai and the communication circuit N based on the communication timing information 36 indicating the communication timings. In this way, clock pulses of the clock S are masked at the timings other than the communication timings at which communication is performed between the circuits Ai and the communication circuit N to generate the clock S' and the clocks Ai.

As a result, no clock pulse of the clocks Ai is masked at the communication timings, and therefore a clock pulse is always output at the communication timings in the clocks Ai. Accordingly, the circuit Ai can receive a signal output by the communication circuit N at an expected timing. Similarly, the circuit Ai can output a signal at a timing expected by the communication circuit N.

Therefore, according to a clock frequency divider circuit in accordance with the first exemplary embodiment, it is possible to generate an output clock signal (clock Ai) that makes it possible to perform data communication even with a circuit (communication circuit N) to be communicated that is operating by a clock signal having a different frequency (clock N) without impairing the communication performance. In this way, the need for a special clock transfer circuit and/or special timing design for communication with a circuit operating by a clock signal having a different frequency is eliminated, thus enabling a rational-number frequency division to be performed on a clock signal with a low power, a small size, and a low design cost.

Further, in the first exemplary embodiment, mask timings at which clock pulses are masked are assigned to timings other than communication timings at which communication with the circuit to be communicated is performed according to the frequency division ratio setting 35 in the mask control circuit 30. Therefore, for example, even when the frequency division ratio N/M is changed to any of the frequency division rations 11/12 to 3/12, clock pulses of the clock S and clock S' can be masked at timings other than the communication timings T0, T4 and T8. Therefore, even when the frequency division ratio is changed, it is unnecessary to change the clock N and/or the communication timing of the communication circuit N. Therefore, it is possible to cope with the change of the frequency division ratio in an extremely flexible manner.

Second Exemplary Embodiment

Figure 5:
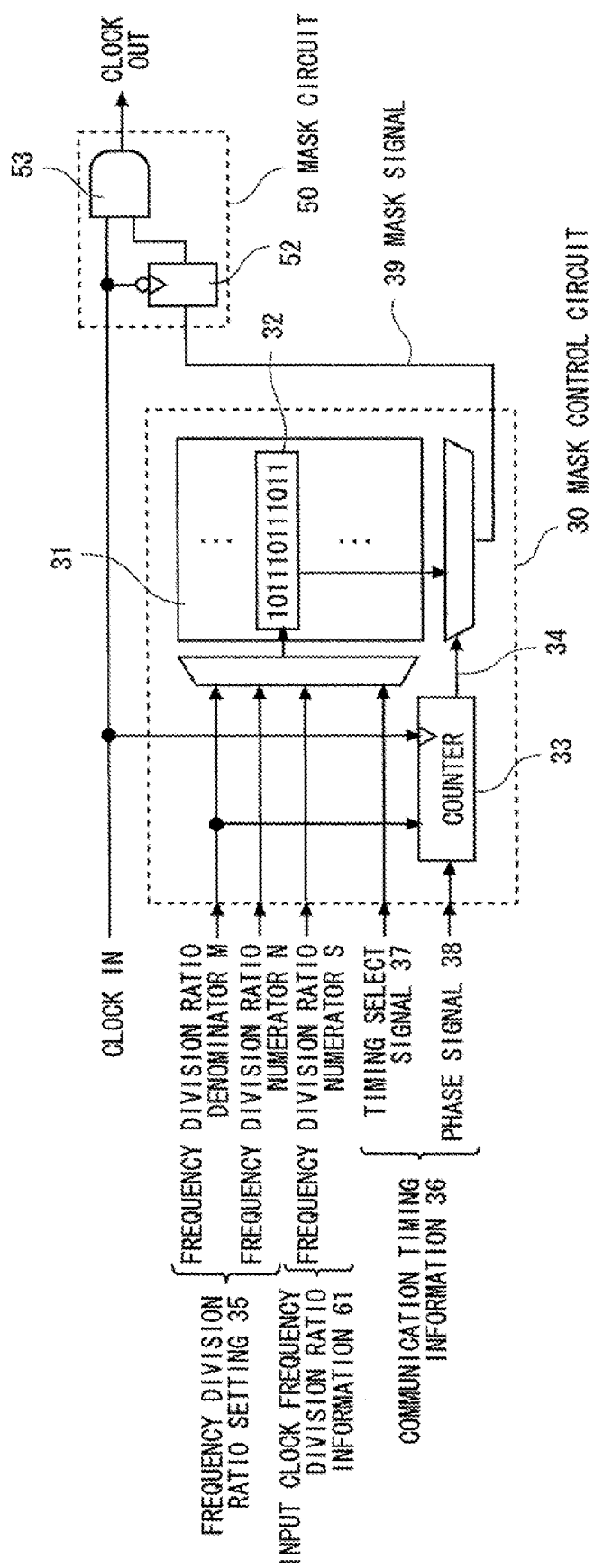
FIG. 5 is a configuration diagram of a clock frequency divider circuit in accordance with a second exemplary embodiment of the present invention.

Next, a clock frequency divider circuit in accordance with a second exemplary embodiment of the present invention is explained with reference to FIG. 5. FIG. 5 is a block diagram of a clock frequency divider circuit in accordance with the second exemplary embodiment of the present invention. In the second exemplary embodiment of the present invention, specific examples of the mask circuit 50 and the mask control circuit 30 of the clock frequency divider circuit 10 in accordance with the first exemplary embodiment are explained.

In FIG. 5, the mask circuit 50 has a function of selecting whether a clock IN pulse is masked or is output as the clock OUT without being masked by referring to an input mask signal 39. In the second exemplary embodiment, this mask circuit 50 includes a latch circuit 52 and a gate circuit 53.

The latch circuit 52 has a function of restricting the transition of the mask signal 39 that is input to the gate circuit 53 to timings at which the value of the clock IN is "0" by latching the mask signal 39 at falling edge timings of the clock IN. The gate circuit 53 has a function of masking the clock IN based on the mask signal 39 latched by the latch circuit 52. When the value of the mask signal 39 is "0", the clock IN is masked. When the value of the mask signal 39 is "1", the clock IN is not masked.

The provision of the latch circuit 52 can prevent the occurrence of glitches in the clock OUT. Although the provision of the latch circuit 52 makes the timing design easier, the latch circuit 52 can be omitted if the occurrence of glitches is prevented by implementing precise timing design. Further, although an AND circuit is used as the gate circuit 53 to mask the clock IN in FIG. 5, the present invention is not limited to this configuration. An OR circuit or other circuits having a similar function may be also used.

The mask control circuit 30 counts the clock pulses of the clock IN based on the frequency division ratio setting 35, the communication timing information 36, and the input clock frequency division ratio information 61. In this way, the mask control circuit 30 has a function of generating a counter value indicating the relative phase of the clock IN and the clock OUT, and generating and outputting a mask signal 39 in which mask timings are assigned based on the counter value.

In the second exemplary embodiment, this mask control circuit 30 includes a counter 33 and a table circuit 31. Further, the frequency division ratio setting 35 is composed of a frequency division ratio denominator M and a frequency division ratio numerator N each composed of parallel data consisting of a plurality of bits, and defines a frequency division ratio setting N/M.

Further, the communication timing information 36 is composed of a timing select signal 37 and a phase signal 38. The timing select signal 37 is a signal that is used to select a communication timing from timings included in a period in which the phase relation between the clock OUT (clock S' or clocks Ai) and a clock signal (clock N), by which a circuit to be communicated with the circuit operating by the clock OUT is operating, makes a full circle. The timing select signal 37 is composed of parallel data consisting of a plurality of bits indicating a value specifying communication timings, and its value does not change unless the communication timing is changed. The phase signal 38 is a signal indicating the relative phase relation between the clock OUT and a clock signal by which a circuit to be communicated with the circuit operating by the clock OUT is operating (hereinafter expressed as "clock signal at the other end of communication").

The input clock frequency division ratio information 61 is composed of a frequency division ratio numerator S composed of parallel data consisting of a plurality of bits, and defines the frequency division ratio S/M of the input clock signal. The value of the denominator M is the same as that in the frequency division ratio setting 35. Therefore, the frequency division ratio denominator M of the frequency division ratio setting 35 is also used as the denominator M of the frequency division ratio S/M, so that the duplicated input is omitted.

The counter 33 has a function of counting the clock pulses of the clock IN. Further, when the phase relation between the clock OUT and the clock signal at the other end of communication makes a full circle, the counter 33 resets the counter value to the initial value in synchronization with the timing of the phase signal 38 and outputs a counter value 34 indicating the relative phase of the clock OUT and the clock signal at the other end of communication. In this way, the number of cycles in which the phase relation between the clock OUT and the clock signal at the other end of communication makes a full circle is output from the counter 33 as a counter value 34.

The table circuit 31 has a function of holding table data 32 in table format in advance. In the table data 32, the necessity/non-necessity of masking is indicated for each combination of the counter value 34, the frequency division ratio denominator M and the frequency division ratio numerator N, i.e., the frequency division ratio setting 35, the frequency division ratio numerator S, i.e., the input clock frequency division ratio information 61, and the timing select signal 37. Further, the table circuit 31 also has a function of selecting table data according to the combination of these input values and outputting the selected table data as a mask signal 39. In this way, a mask signal 39 that is used to control whether or not the clock pulse of the clock IN is masked in the mask circuit 50 according to the frequency division ratio denominator M, the frequency division ratio numerator N, the counter value 34, the frequency division ratio numerator S, and the timing select signal 37 is output from the table circuit 31 for each clock pulse of the clock IN.

Next, an operation of a clock frequency divider circuit in accordance with the second exemplary embodiment is explained with reference to FIGS. 6 and 7.

Figure 6:
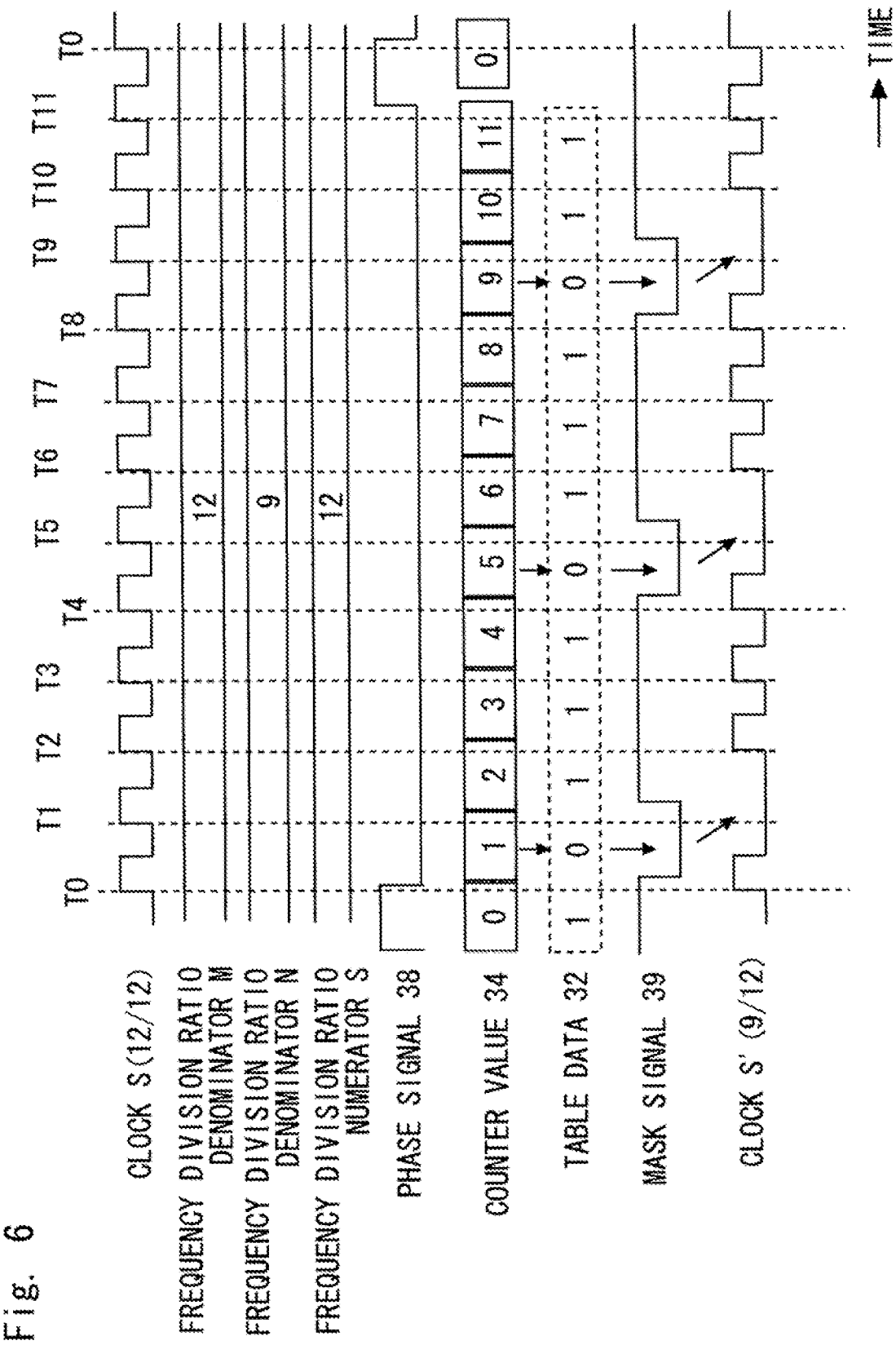
FIG. 6 is a timing chart showing an operation of a clock frequency divider circuit in accordance with a second exemplary embodiment of the present invention.

FIG. 6 is a timing chart showing an operation of the clock frequency divider circuit 10b in accordance with the second exemplary embodiment of the present invention.

A case where a clock S' corresponding to a frequency division ratio 9/12 is generated from a clock S is explained hereinafter. Assume that the circuits Ai and the communication circuit N perform data communication at all the rising edge timings of the clock N. Further, the clock N is in synchronization with the clock S and its frequency division ratio is one fourth of the clock S. That is, the circuits Ai and the communication circuit N communicate with each other at timings T0, T4 and T8.

The timing select signal 37 is a signal indicating that the communication timing is timings T0, T4 and T8, and its value does not change unless the communication timing is changed.

The phase signal 38 is a signal that becomes "1" at any one cycle of the rising edge timings of the clock N in a period in which the phase relation between the clock S' and the clock N makes a full circle, and becomes "0" at all the other cycles. In the case of FIG. 6, the phase signal 38 becomes "1" at a timing T0, which is one of the twelve cycles of the clock S in which the phase relation makes a full circle.

The clock S, which is an input clock signal, is a clock signal on which no frequency division was performed. Therefore, the frequency division ratio is one, that is, S/M=12/12. Therefore, a value 12 is set to the frequency division ratio numerator S.

The counter 33 resets the counter value to the initial value at a timing at which the phase signal 38 becomes "1". After that, the twelve cycles in which the phase relation between the clock S' and the clock N makes a full circle is repeated and the clock pulses of the clock S is counted. In this way, a counter value 34 indicating the phase relation between the clock S' and the clock N is output from the counter 33.

In FIG. 6, the timings at which the counter value 34 takes on values "0" to "11" correspond to the timings T0 to T11 respectively. That is, the counter value 34 becomes "0" at the timing T0, becomes "1" at the timing T1, . . . , and becomes "11" at the timing T11. After that, the counter value 34 becomes "0" again at the timing T0.

In the table data 32 of the table circuit 31, "0" is set when the pulse of the clock S is to be masked at the next cycle and "1" is set when the pulse is not to be masked at the next cycle for each combination of the frequency division ratio denominator M, the frequency division ratio numerator N, the counter value 34, the frequency division ratio numerator S, and the timing select signal 37. Therefore, a value of the table data 32 according to the combination of the frequency division ratio denominator M, the frequency division ratio numerator N, the counter value 34, the frequency division ratio numerator S, and the timing select signal 37, which are input at each timing, is output as a mask signal 39.

In the case of FIG. 6, table data 32 in which mask timings are assigned to combinations corresponding to timings T1, T5 and T9, which are timings other than the communication timings of data communication between the circuits Ai and the communication circuit N, among the timings T0 to T11 is set in advance in the table circuit 31. Further, non-mask timings are assigned to combinations corresponding to the other timings, i.e., timings T0, T2, T3, T4, T6, T7, T8, T10 and T11.

In this way, when the counter value is "1", "5" or "9", for example, the value "0" indicating a mask timing is output as the table data 32 from the table circuit 31 as a mask signal 39. Further, for all the other cases, the value "1" indicating a non-mask timing is output as the table data 32 from the table circuit 31 as a mask signal 39. The mask circuit 50 refers to this mask signal 39 and thereby masks pulses of the clock S at the timings T1, T5 and T9. Further, the mask circuit 50 outputs pulses of the clock S as the clock. S' without masking them at the other timings.

Therefore, clock pulses of the clock S are always output as the clock S' without being masked at the timings T0, T4 and T8, which are the communication timings, among the timings T0 to T11. Meanwhile, some of the clock pulses at the timings other than the communication timings, i.e., clock pulses at timings T1, T5 and T9 in this example, among the timings T0 to T11 are masked and thereby are not output as the clock Sb.

In FIG. 6, although a generation example in a specific case where: the frequency division ratio of the clock S' is 9/12; the frequency of the clock N is one fourth of the clock S; and communication is performed at all the rising edge timings of the clock N is shown, the operation may be also performed in a similar manner in other cases. By appropriately setting the value of the table data 32 for each combination of the communication timing information 36, the frequency division ratio setting 35, the input clock frequency division ratio information 61, and the counter value 34 indicating the relative phase relation between the clock S' and the clock N, it is possible to realize an arbitrary rational-number frequency division by preventing clock pulses located at the communication timings from being masked and masking some of clock pulses located at the timings other then the communication timings.

Further, although the frequency division ratio denominator M, the frequency division ratio numerator N, the frequency division ratio numerator S, and the like, which are input to the mask control circuit 30, are fixed values in FIG. 6, they may be changed as appropriate during the operation within the range in which the table circuit 31 holds the table data 32 corresponding to these values.

Figure 7:
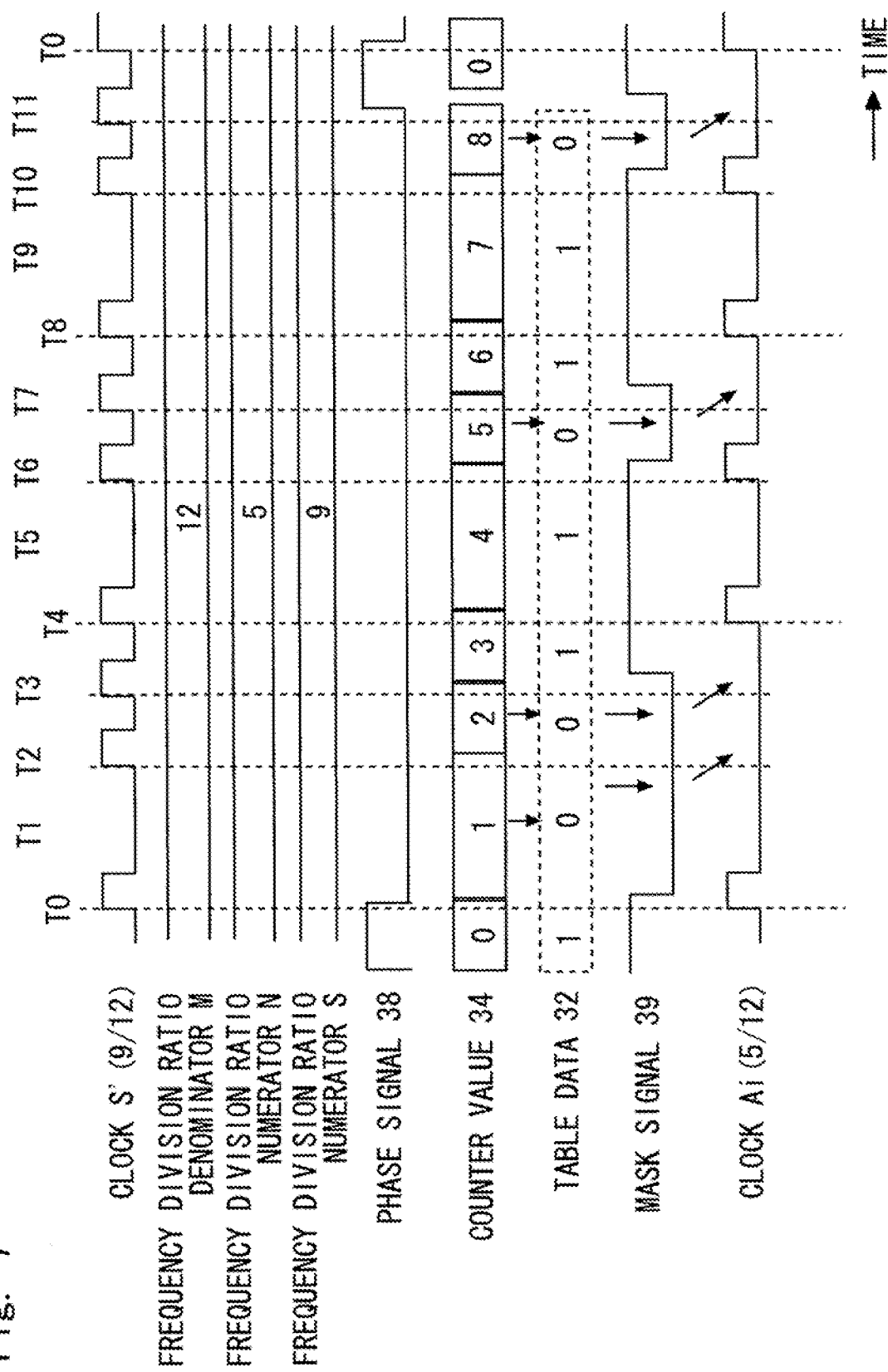
FIG. 7 is a timing chart showing an operation of a clock frequency divider circuit in accordance with a second exemplary embodiment of the present invention.

FIG. 7 is a timing chart showing an operation of a clock frequency divider circuit 10a in accordance with the second exemplary embodiment of the present invention.

A case where a clock Ai corresponding to a frequency division ratio 5/12 is generated from a clock S' corresponding to a frequency division ratio 9/12 generated by the clock frequency divider circuit 10b is explained hereinafter. Assume that the circuit Ai and the communication circuit N perform data communication at all the rising edge timings of the clock N. Further, the clock N is in synchronization with the clock S and its frequency division ratio is one fourth of the clock S. That is, the circuit Ai and the communication circuit N communicate with each other at timings T0, T4 and T8.

The timing select signal 37 is a signal indicating that the communication timing is timings T0, T4 and T8, and its value does not change unless the communication timing is changed.

The phase signal 38 is a signal that becomes "1" at any one cycle of the rising edge timings of the clock N in a period in which the phase relation of the clock Ai and the clock N makes a full circle, and becomes "0" at all the other cycles. In the case of FIG. 7, the phase signal 38 becomes "1" at a timing T0, which is one of the twelve cycles of the clock S in which the phase relation makes a full circle.

Since the frequency division ratio S/M of the clock S', which is an input clock signal, is 9/12, a value "9" is set to the frequency division ratio numerator S.

The counter 33 resets the counter value to the initial value at a timing at which the phase signal 38 becomes "1". After that, the twelve cycles in which the phase relation of the clock Ai and the clock N makes a full circle, which corresponds to the nine cycles of the clock S', is repeated and the clock pulses of the clock S' is counted. In this way, a counter value 34 indicating the phase relation of the clock Ai and the clock N is output from the counter 33. Since the counter 33 operates by the clock S', the counter value 34 takes on values "0" to "8" corresponding to the nine cycles of the clock S'.

In FIG. 7, the timings at which the counter value 34 takes on values "0" to "8" correspond to the timings T0 to T11. That is, the counter value 34 becomes "0" at the timing T0, "1" at the timings T1 and T2, "2" at the timing T3, "3" at the timing T4, "4" at the timings T5 and T6, "5" at the timing T7, "6" at the timing T8, "7" at the timings T9 and T10, and "8" at the timing T11. After that, the counter value 34 becomes "0" again at the timing T0.

In the table data 32 of the table circuit 31, "0" is set when the pulse of the clock S' is to be masked at the next cycle and "1" is set when the pulse is not to be masked at the next cycle for each combination of the frequency division ratio denominator M, the frequency division ratio numerator N, the counter value 34, the frequency division ratio numerator S, and the timing select signal 37. Therefore, a value of the table data 32 according to the combination of the frequency division ratio denominator M, the frequency division ratio numerator N, the counter value 34, the frequency division ratio numerator S, and the timing select signal 37, which are input at each timing, is output as a mask signal 39.

In the case of FIG. 7, table data 32 in which mask timings are assigned to combinations corresponding to timings T1, T2, T3, 15, T7, T9 and T11, which are timings other than the communication timing of data communication between the circuit Ai and the communication circuit N, among the timings T0 to T11 is set in advance in the table circuit 31. Further, non-mask timings are assigned to combinations corresponding to the other timings, i.e., timings T0, T4, T6, T8 and T10.

In this way, when the counter value is "1", "2", "5" or "8", for example, the value "0" indicating a mask timing is output as the table data 32 from the table circuit 31 as a mask signal 39. Further, for all the other cases, the value "1" indicating a non-mask timing is output as the table data 32 from the table circuit 31 as a mask signal 39. The mask circuit 50 refers to this mask signal 39 and thereby masks pulses of the clock S' at the timings T1, T5 and T9. Further, the mask circuit 50 outputs pulses of the clock S' as the clock Ai without masking them at the other timings.

Therefore, clock pulses of the clock S' are always output as a clock Ai without being masked at the timings T0, T4 and T8, which are the communication timings, among the timings T0 to T11. Meanwhile, some of the clock pulses at the timings other than the communication timings, i.e., clock pulses at timings T1, T2, T3, 15, T7, T9 and T11 in this example, among the timings T0 to T11 are masked and thereby are not output as the clock Ai.

In FIG. 7, although a generation example in a case where: the frequency division ratio of the clock S' is 9/12; the frequency division ratio of the clock Ai is 5/12; the frequency of the clock N is one fourth of the clock S; and communication is performed at all the rising edge timings of the clock N is shown, the operation may be also performed in a similar manner in other cases. By appropriately setting the value of the table data 32 for each combination of the communication timing information 36, the frequency division ratio setting 35, the input clock frequency division ratio information 61, and the counter value 34 indicating the relative phase relation between the clock Ai and the clock N, it is possible to realize an arbitrary rational-number frequency division by preventing clock pulses located at the communication timings from being masked and masking some of clock pulses located at the timings other then the communication timings.

Further, although the frequency division ratio denominator M, the frequency division ratio numerator N, the frequency division ratio numerator S, and the like, which are input to the mask control circuit 30, are fixed values in FIG. 7, they may be changed as appropriate during the operation within the range in which the table circuit 31 holds the table data 32 corresponding to these values.

As has been described above, in the second exemplary embodiment, the clock pulses of the input clock signal is counted by the counter in the mask control circuit, and the counter value is reset to the initial value at the time when the phase relation between the output clock signal and the clock signal that drives a circuit to be communicated with the circuit operating by the output clock signal makes a full circle. By doing so, a count value indicating the relative phase of the communication timing with respect to the input clock signal is generated, and a mask signal in which mask timings are assigned based on this count value is generated. Therefore, the relative phase of the communication timing with respect to the input clock signal can be derived by using a very simple circuit configuration, i.e., by using a counter, and therefore it is possible to accurately assign mask timings at timings other than the communication timing.

Further, in the second exemplary embodiment, table data indicating the necessity/non-necessity of masking for each combination of at least the communication timing information, the frequency division ratio setting, the input clock frequency division ratio information, and the count value is held in advance in the table circuit in the mask control circuit, and table data that is output from the table circuit according to the input combination is output as a mask signal. By doing so, it is possible to accurately assign desired mask timings at timings other than the communication timing according to the relative phase of the communication timing with respect to the input clock signal by using a very simple circuit configuration, i.e., by using a table circuit.

Further, in the second exemplary embodiment, table data indicating the necessity/non-necessity of masking for each combination of at least the communication timing information, the frequency division ratio setting, the input clock frequency division ratio information, and the count value is held in advance in the table circuit in the mask control circuit, and table data that is output from the table circuit according to the input combination is output as a mask signal. By doing so, it is possible to accurately assign desired mask timings at timings other than the communication timing according to the relative phase of the communication timing with respect to the input clock signal even when the input clock signal is a clock signal on which a frequency division was performed in advance.

Further, although the frequency division ratio setting 35 that is input by the mask control circuit 30 is composed of the frequency division ratio denominator M indicating the value of the denominator of the frequency division ratio and the frequency division ratio numerator N indicating the value of the numerator of the frequency division ratio in the second exemplary embodiment, other formats capable of setting the frequency division ratio may be also used. Similarly, although the communication timing information that is input by the mask control circuit 30 is composed of the timing select signal 37 used to select the communication timing and the phase signal 38 indicating the phase relation between the output clock signal and the clock signal at the other end of communication in the second exemplary embodiment, other formats capable of designating the communication timing may be also used. Further, signals that are not indispensable for the setting of the frequency division ratio and the designation of the communication timing may be omitted as appropriate. In the case where the communication timing is located only at a specific timing, for example, the table data 32 does not necessarily have to be prepared for each value of the timing select signal 37, and therefore the timing select signal 37 can be omitted.

Further, since the clock frequency divider circuit 10 in accordance with the second exemplary embodiment is entirely composed of digital logic circuits to select whether the clock IN is masked or not and thereby to realize a rational-number frequency division, its power consumption and layout size are small. Further, since the clock frequency divider circuit 10 does not require any analog circuit and any special design, its design/testing cost is low.

INDUSTRIAL APPLICABILITY

The present invention can be widely applied to semiconductor circuits in which clock signals having different frequencies are distributed to a plurality of circuit blocks, and to fields of electronic devices using such semiconductor circuits.

REFERENCE SIGNS LIST

10, 10A, 10B CLOCK FREQUENCY DIVIDER CIRCUIT
20 CLOCK TREE CIRCUIT
22 CLOCK BUFFER
30 MASK CONTROL CIRCUIT
31 ABLE CIRCUIT
32 TABLE DATA
33 COUNTER
34 COUNTER VALUE
35 FREQUENCY DIVISION RATIO SETTING
36 COMMUNICATION TIMING INFORMATION
37 TIMING SELECT SIGNAL
38 PHASE SIGNAL
39 MASK SIGNAL
50 MASK CIRCUIT
52 LATCH CIRCUIT
53 GATE CIRCUIT
61 INPUT CLOCK FREQUENCY DIVISION RATIO INFORMATION
100 CLOCK FREQUENCY DIVIDER CIRCUIT

The invention claimed is:

1. A clock frequency divider circuit that generates an output clock signal obtained by dividing a frequency of an input clock signal into N/S (N is positive integer and S is positive integer greater than N) by subtracting (S−N) clock pulses from S clock pulses of the input clock signal based on a frequency division ratio defined as N/S, the clock frequency divider circuit comprising:
   a control circuit that generates a control signal used to preferentially subtract a clock pulse at a timing other than a communication timing of data communication performed by a target circuit using the output clock signal among S clock pulses of the input clock signal; and
   a processing circuit that generates the output clock signal by subtracting a clock pulse of the input clock signal according to the control signal generated by the control circuit.

2. The clock frequency divider circuit according to claim 1, wherein the processing circuit comprises a processing circuit that generates the output clock signal by masking some of a plurality of clock pulses included in the input clock signal according to the control signal.

3. The clock frequency divider circuit according to claim 2, wherein, when the frequency division ratio is larger, the control circuit generates the control signal that masks the clock pulse that is determined to be masked when the frequency division ratio is small.

4. The clock frequency divider circuit according to claim 2, wherein the control circuit comprises a table circuit that holds table data indicating necessity/non-necessity of masking for each combination of at least a frequency division ratio denominator S and a frequency division ratio numerator N defining the frequency division ratio in advance, and outputs table data output from the table circuit according to an input combination as the control signal.

5. The clock frequency divider circuit according to claim 4, wherein the table circuit holds table data indicating necessity/non-necessity of masking for each combination of the frequency division ratio denominator S, the frequency division ratio numerator N, and an additional frequency division ratio denominator M of S/M (S is positive integer and M is positive integer greater than S) defining a frequency division ratio of the input clock signal in advance.

6. The clock frequency divider circuit according to claim 4, wherein the table circuit holds table data indicating necessity/non-necessity of masking for each combination of the frequency division ratio denominator S, the frequency division ratio numerator N, a frequency division ratio denominator M, an additional information about the communication timing, and the count value in advance, and outputs table data output from the table circuit according to an input combination as the control signal.

7. The clock frequency divider circuit according to claim 6, wherein the information about the communication timing further includes communication timing select information that indicates a timing at which the target circuit and a communication circuit perform data communication.

8. The clock frequency divider circuit according to claim 2, wherein the control circuit generates a count value indicating a relative phase of the communication timing with respect to the input clock signal by counting clock pulses of the input clock signal and, when the count value reaches a frequency division ratio denominator S, resetting the count value to an initial value, and generates the control signal based on this count value.

9. A clock frequency division method to generate an output clock signal obtained by dividing a frequency of an input clock signal into N/S (N is positive integer and S is positive integer greater than N) by subtracting (S−N) clock pulses from S clock pulses of the input clock signal based on a frequency division ratio defined as N/S, the clock frequency division method comprising:
- determining a clock pulse at a timing other than a communication timing of data communication performed by a target circuit using the output clock signal among S clock pulses of the input clock signal; and
- generating the output clock signal by subtracting the determined clock pulse.

10. The clock frequency division method according to claim 9, wherein in the generation of the output clock signal, the output clock signal is generated by masking some of a plurality of clock pulses included in the input clock signal.

11. The clock frequency division method according to claim 10, wherein any clock pulse, which is determined as a clock pulse to be masked when the frequency division ratio is small, is included into clock pulses to be masked when the frequency division ratio is larger.

* * * * *